(12) United States Patent
Huang et al.

(10) Patent No.: US 12,224,263 B2
(45) Date of Patent: *Feb. 11, 2025

(54) METHOD FOR TRANSFERRING ELECTRONIC DEVICE

(71) Applicant: Micraft System Plus Co., Ltd., Taoyuan (TW)

(72) Inventors: Yu-Min Huang, Taoyuan (TW); Sheng Che Huang, Taoyuan (TW); Chingju Lin, Taoyuan (TW); Wei-Hao Wang, Taoyuan (TW)

(73) Assignee: Micraft System Plus Co., Ltd., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,443

(22) Filed: Mar. 5, 2024

(65) Prior Publication Data

US 2024/0213209 A1    Jun. 27, 2024

Related U.S. Application Data

(63) Continuation of application No. 17/577,406, filed on Jan. 18, 2022, now Pat. No. 11,973,054.

(30) Foreign Application Priority Data

Jul. 23, 2021    (TW) .................. 110127169

(51) Int. Cl.
*B23K 1/00*    (2006.01)
*B23K 1/005*    (2006.01)
(Continued)

(52) U.S. Cl.
CPC ............ *H01L 24/75* (2013.01); *B23K 1/0053* (2013.01); *B23K 1/0056* (2013.01); *H01L 24/80* (2013.01);
(Continued)

(58) Field of Classification Search
CPC . H01L 2224/16238; H01L 2224/75312; H01L 2224/75317; H01L 2224/75318;
(Continued)

(56) References Cited

U.S. PATENT DOCUMENTS 5,055,652 A * 10/1991 Jones .................... B23K 1/0056
219/121.64
5,693,559 A * 12/1997 Taniguchi ............... B41F 15/16
427/98.5

(Continued)

FOREIGN PATENT DOCUMENTS

CN    1201364 A  * 12/1998  ........... B23K 1/0056
CN    101286458 B  *  6/2011  ......... H01L 21/4839

(Continued)

*Primary Examiner* — Kiley S Stoner
(74) *Attorney, Agent, or Firm* — JCIPRNET

(57) ABSTRACT

A method for transferring an electronic device includes steps as follows. A flexible carrier having a first surface on which the electronic device to be transferred is disposed and a second surface, a target substrate, a target substrate, and a light-transmissible pin having a pressing end are provided. The flexible carrier is spaced from the target substrate with the first surface thereof facing the target substrate. The flexible carrier is deformed by exerting the pin to press the second surface with the pressing end thereof at a position corresponding to the electronic device until the electronic device is in contact with the target substrate. An energy beam emitted from a light source standing outside the pin and then traveling through the pin and going out from the pressing end to bond the electronic device onto the target substrate is applied. The pin is released from pressing the flexible carrier.

7 Claims, 10 Drawing Sheets

Related U.S. Application Data

(60) Provisional application No. 63/185,328, filed on May 6, 2021.

(51) Int. Cl.
*H01L 23/00* (2006.01)
*B23K 101/40* (2006.01)

(52) U.S. Cl.
CPC .......... *H01L 24/81* (2013.01); *B23K 2101/40* (2018.08); *H01L 2224/75263* (2013.01); *H01L 2224/75283* (2013.01); *H01L 2224/75705* (2013.01); *H01L 2224/7598* (2013.01); *H01L 2224/80224* (2013.01); *H01L 2224/8023* (2013.01); *H01L 2224/80815* (2013.01); *H01L 2224/81191* (2013.01); *H01L 2224/81192* (2013.01); *H01L 2224/81224* (2013.01); *H01L 2224/8123* (2013.01); *H01L 2224/81815* (2013.01)

(58) Field of Classification Search
CPC ... H01L 2224/7532; H01L 2224/81203; H01L 2224/81937; H01L 2224/81939; H01L 2224/951; H01L 24/75; H01L 24/80; H01L 24/81; H01L 2224/75263; H01L 2224/75283; H01L 2224/75705; H01L 2224/7598; H01L 2224/80224; H01L 2224/8023; H01L 2224/80815; H01L 2224/81191; H01L 2224/81192; H01L 2224/81224; H01L 2224/8123; H01L 2224/81815; H01L 2224/16227; B23K 1/0053; B23K 1/0056; B23K 2101/36–42; B23K 1/0016

USPC .......... 228/179.1–180.22, 245–262; 219/121.6–121.86

See application file for complete search history.

(56) References Cited

U.S. PATENT DOCUMENTS

| | | | |
|---|---|---|---|
| 10,410,905 B1* | 9/2019 | Peterson | H01L 21/67132 |
| 11,387,212 B2* | 7/2022 | Huang | H01L 24/94 |
| 2012/0115262 A1* | 5/2012 | Menard | H01L 31/048 29/829 |
| 2014/0259648 A1* | 9/2014 | Tanaka | H01L 24/75 29/740 |
| 2016/0276205 A1* | 9/2016 | Huska | H01L 23/53242 |
| 2018/0122673 A1* | 5/2018 | Wendt | H01L 24/83 |
| 2018/0141163 A1* | 5/2018 | Wendt | B23K 26/0846 |
| 2018/0144971 A1* | 5/2018 | Peterson | H01L 21/67766 |
| 2018/0226376 A1* | 8/2018 | Huska | H01L 24/75 |
| 2018/0248090 A1* | 8/2018 | Huska | H01L 24/16 |
| 2020/0105551 A1* | 4/2020 | Wendt | H01L 21/677 |
| 2021/0252620 A1* | 8/2021 | Choi | B23K 35/3613 |

FOREIGN PATENT DOCUMENTS

| | | | | |
|---|---|---|---|---|
| EP | 1260302 A1 | * | 11/2002 | B23K 1/0056 |
| JP | 2009088321 A | * | 4/2009 | H01L 24/75 |
| KR | 20100109137 A | * | 10/2010 | |
| KR | 20200109852 A | * | 9/2020 | |
| KR | 102174929 B1 | * | 11/2020 | |
| KR | 20200129340 A | * | 11/2020 | |
| TW | 202030041 A | * | 8/2020 | B23K 1/0056 |
| WO | WO-9625263 A3 | * | 9/1996 | B23K 20/10 |
| WO | WO-2010050209 A1 | * | 5/2010 | H01L 24/75 |
| WO | WO-2021100960 A1 | * | 5/2021 | B23K 1/0016 |

* cited by examiner

METHOD FOR TRANSFERRING ELECTRONIC DEVICE

CROSS-REFERENCE TO RELATED APPLICATION

This application is a continuation application of and claims the priority benefit of U.S. application Ser. No. 17/577,406, filed on Jan. 18, 2022, now patented as U.S. Pat. No. 11,973,054 B2, issued on Apr. 30, 2024, which claims the priority benefit of U.S. provisional application Ser. No. 63/185,328, filed on May 6, 2021, and Taiwan application serial no. 110127169, filed on Jul. 23, 2021. The entirety of each of the above-mentioned patent application is hereby incorporated by reference herein and made a portion of this specification.

BACKGROUND

Technology Field

The disclosure relates to a method of transferring devices, and particularly to, a method for transferring an electronic device.

Description of Related Art

In processing electronic products, there are often steps related to transferring electronic devices. For example, in processing LED displays, first, light-emitting diodes are disposed on a thin film transistor (TFT) array substrate often by a pick-and-place apparatus, and then the light-emitting diodes on the TFT array substrate are fixed and electrically connected to the TFT array substrate. However, with the method, if there are slight vibrations in the environment or equipment, after the light-emitting diodes are disposed on the TFT array substrate, and before the light-emitting diodes are fixed on the TFT array substrate, the unfixed light-emitting diodes may consequently shift. Moreover, with the method, the throughput may be low.

SUMMARY

The disclosure provides a method for transferring an electronic device.

The method for transferring an electronic device of the disclosure including following steps is provided: providing a flexible carrier having a first surface on which the electronic device to be transferred is disposed and a second surface which is opposite to the first surface; providing a target substrate; providing a pin which is light-transmissible and has a pressing end; arranging the flexible carrier and the target substrate in a way that the flexible carrier is spaced from the target substrate with the first surface thereof facing the target substrate; deforming the flexible carrier by exerting the pin to press the second surface of the flexible carrier with the pressing end thereof at a position corresponding to the electronic device disposed on the first surface of the flexible carrier until the electronic device is in contact with the target substrate; applying an energy beam which is emitted from a light source standing outside the pin and then travels through the pin and goes out from the pressing end of the pin to bond the electronic device onto the target substrate; and releasing the pin from pressing the flexible carrier.

In summary, the electronic device on the flexible carrier may be transferred and soldered to the target substrate with the method for transferring the electronic device.

DESCRIPTION OF THE EMBODIMENTS

Figure 1:
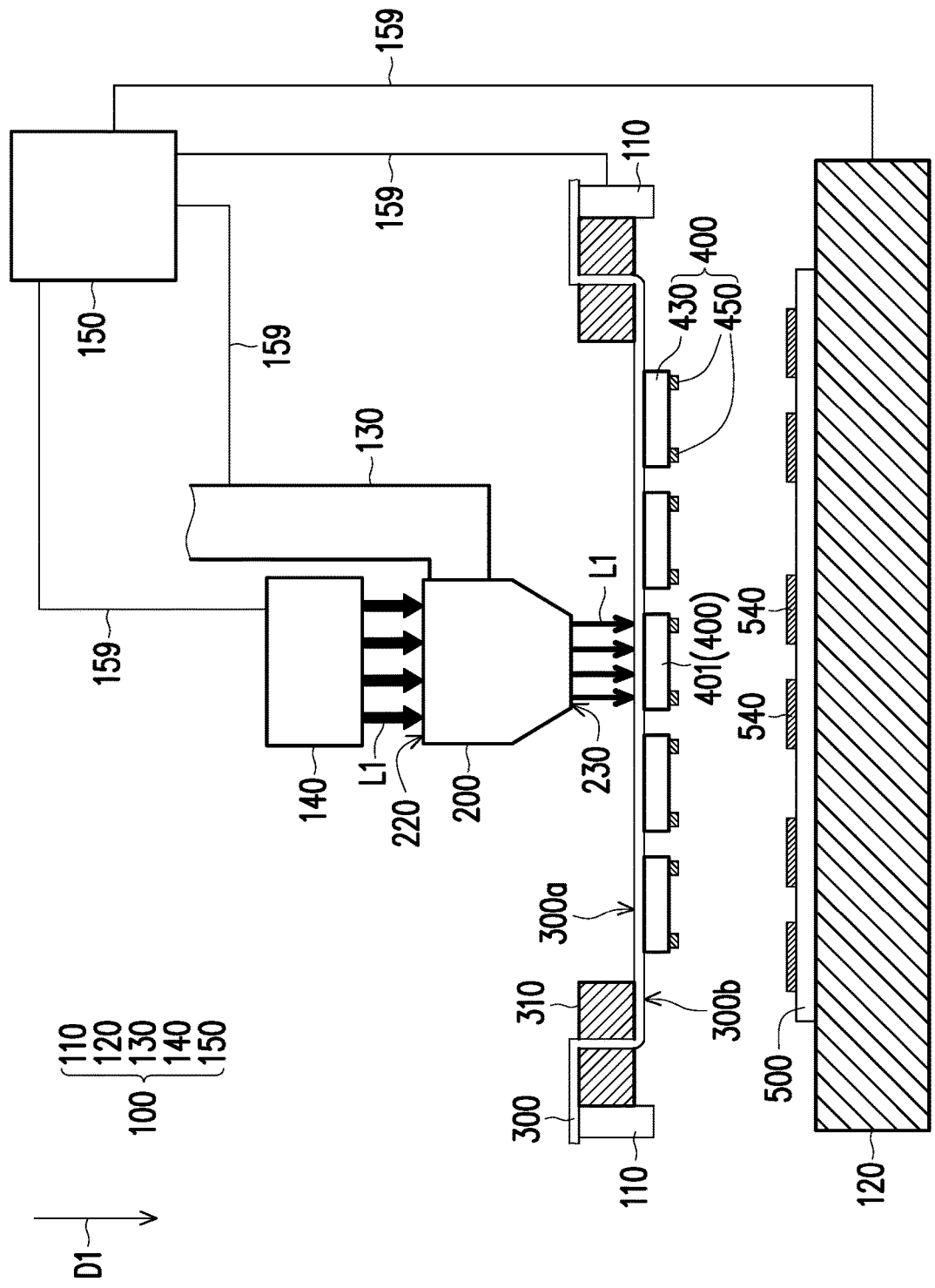
FIG. 1 to FIG. 7 are schematic side views of a portion of the action of an apparatus for transferring an electronic device according to an embodiment of the disclosure.

Contents in the following embodiments serve to illustrate rather than limit the disclosure. In addition, description of well-known apparatuses, methods, and materials may be omitted so as not to obscure the illustration of various principles of the disclosure. Directional terminology (e.g., above, below, top, bottom) used in the specification is only with reference to the drawings or in correspondence to conventional terminology and is not intended to imply absolute orientations. Moreover, unless with clear indications in the specification, the singular forms "one", "a", "the" or forms without specifically indicating a quantity may include one or more forms, that is, include "at least one."

For clarity, in some drawings, dimensions of some elements or film layers may be increased, reduced, or omitted. Similar elements are denoted by the same reference numerals and have similar functions, materials, or manners of formation, and description thereof is omitted. It will be obvious to those ordinarily skilled in the related art that with the description of the contents of the embodiments and the corresponding drawings, the disclosure may be implemented in other embodiments that depart from the specific details disclosed in the specification.

Referring to FIG. 1, a flexible carrier 300 is provided. A plurality of electronic devices 400 may be disposed on the flexible carrier 300. Note that, in FIG. 1, the quantity and/or the configuration of the electronic devices 400 disposed on the flexible carrier 300 are exemplary illustrations, which are not limited in the disclosure.

In the embodiment, the flexible carrier 300 may include a UV tape or a blue tape, but the disclosure is not limited thereto. In an embodiment, the flexible carrier 300 may be fixed by a carrier frame 310, but the disclosure is not limited thereto. In an embodiment, the carrier frame 310 may be referred to as a blue tape frame, but the disclosure is not limited thereto.

In an embodiment, the flexible carrier 300 may include a composite material. For example, the flexible carrier 300 may have a polymer film or ultra-thin glass covered with a glue layer.

In the embodiment, the electronic device 400 may include a die 430 and a conductive connection element 450 disposed on the die 430, but the disclosure is not limited thereto. The die 430 may include a light-emitting die (e.g., a light-emitting diode die; but the disclosure is not limited thereto) or an integrated circuit (IC), but the disclosure is not limited thereto. At least one beam emitted by a light source 140 may be adapted for melting at least a portion of the conductive connection element 450. In an embodiment, the conductive connection element 450 includes a solder, for example, but the disclosure is not limited thereto.

In the embodiment, the flexible carrier 300 may be disposed on a first frame 110. For example, the first frame 110 may indirectly fix the flexible carrier 300 through the carrier frame 310. For example, at a place where the first frame 110 and the flexible carrier 300 are in contact, the flexible carrier 300 may be directly fixed by friction between each other or by other suitable methods. In the embodiment, the material of the first frame 110 may include metal, glass, or plastic, but the disclosure is not limited thereto.

Referring to FIG. 1 again, a target substrate is provided.

In the embodiment, a target substrate 500 may include corresponding circuits, and the circuits may include corresponding pads 540 exposed to the outside. In an embodiment, the target substrate 500 may include a rigid circuit board or a flexible circuit board, but the disclosure is not limited thereto. In an embodiment, the target substrate 500 may be a circuit board (e.g., a TFT array substrate, but the disclosure is not limited thereto) that further includes active elements.

In an embodiment not shown, the electronic device 400 may include a die similar to the die 430, and the target substrate 500 may have a corresponding conductive connection element similar to the conductive connection element 450.

In the embodiment, the target substrate 500 may be disposed on a second frame 120.

In the embodiment, the second frame 120 may not transmit light. The material of the second frame 120 may include metal, plastic, or other materials adapted for supporting or fixing the target substrate 500.

Note that the disclosure does not limit the sequence of providing the target substrate 500 and the flexible carrier 300. Moreover, after the target substrate 500 and the flexible carrier 300 are provided, a surface of the flexible carrier 300 where the electronic devices 400 are disposed may be configured opposite to the target substrate 500. Moreover, the electronic device 400 disposed on the flexible carrier 300 faces the target substrate 500, and there is a corresponding distance in between. Note that, in FIG. 1, the configuration of the target substrate 500 on the second frame 120 and/or the configuration of the flexible carrier 300 on the first frame 110 is only exemplary illustration, which is not limited in the disclosure.

Referring to FIG. 1 again, a pin is provided. The material of a pin 200 may be adapted to allow the beam emitted by the light source 140 to transmit. For example, the transmittance rate of the beam emitted by the light source 140 to the material of the pin 200 is greater than or equal to 50%; greater than or equal to 60%; greater than or equal to 70%; greater than or equal to 75%; greater than or equal to 80%; greater than or equal to 85%; greater than or equal to 90%; greater than or equal to 95%; or greater than or equal to 98%. In an embodiment, the material of the pin 200 may be quartz, but the disclosure is not limited thereto. In an embodiment, the material of the pin 200 may include sapphire (e.g., artificial sapphire) or diamond (e.g., artificial diamond).

In the embodiment, the pin 200 may include a homogeneous material, and with the homogeneous material, elements may no longer be separated into different single materials by mechanical methods (e.g., crushing, shearing, cutting, sawing, grinding, and the like). That is, the inside of the pin 200 may not have an interface formed by different materials, different manufacturing processes (e.g., adhesion), and/or different objects (e.g., embedded objects).

In the embodiment, the light source 140 may emit one or more beams. The beams may refer to different beams having different dominant wavelengths; or different beams have the same dominant wavelength but different total energy or energy density; or different beams have different dominant wavelengths and different total energy or energy density. The beam emitted by the light source 140 may be incident to the pin 200 from another end 220 opposite to the pin end 230 and emitted from the pin end 230 of the pin 200. That is, the beam may transmit at least a portion of the pin 200 and be incident toward the flexible carrier 300 from the pin end 230 of the pin 200.

In the embodiment, the beam emitted by the light source 140 may transmit the flexible carrier 300 more fully. For example, the flexible carrier 300 may have a first surface 300a and a second surface 300b. The second surface 300b is opposite to the first surface 300a. The electronic device 400 is located on the second surface 300b. The beam emitted by the light source 140 may transmit the flexible carrier 300 in the direction from the first surface 300a to the second surface 300b.

In an embodiment, the beam emitted by the light source 140 may be a laser beam. In an embodiment, the beam emitted by the light source 140 may be an infrared beam (e.g., a beam with a wavelength of about 1064 nm, but the disclosure is not limited thereto). For example, the beam emitted by the light source 140 may be an infrared laser beam.

In the embodiment, the pin 200 may be directly or indirectly actuated by an actuating mechanism 130 to relatively move toward the direction of the flexible carrier 300. The actuating mechanism 130 may include movable modules (e.g., horizontal movement modules, vertical movement modules, rotary movement modules, or a combination thereof) commonly used in the design of movable mechanisms. Accordingly, the pin 200 that is directly or indirectly fixed to the actuating mechanism 130 may be moved and/or rotated in a corresponding direction according to design requirements.

Figure 9A:
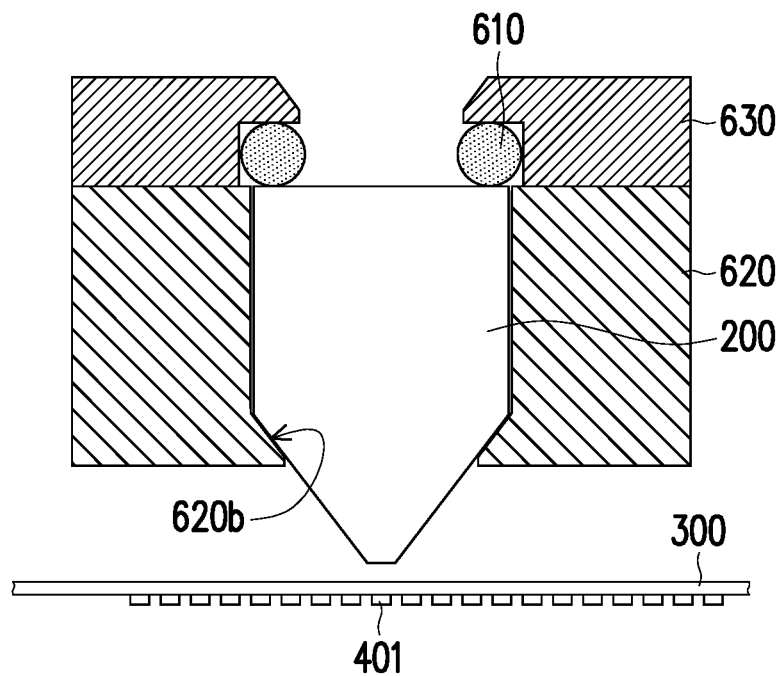
FIG. 9A is a schematic side view of a portion of an apparatus for transferring an electronic device according to an embodiment of the disclosure during operation.
Figure 9B:
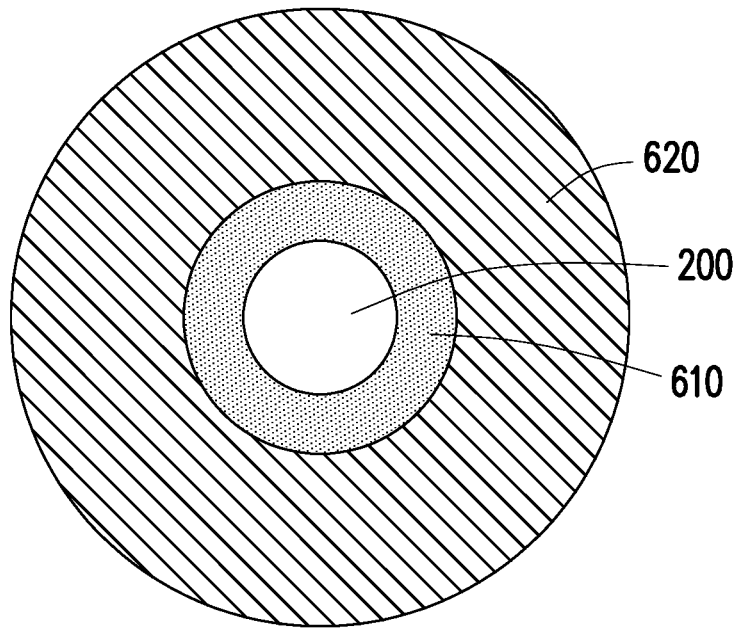
FIG. 9B is a schematic top view of a portion of an apparatus for transferring an electronic device according to an embodiment of the disclosure during operation.

In an embodiment, as shown in FIG. 9A or FIG. 9B, the pin 200 may be indirectly fixed to the actuating mechanism 130, and FIG. 9B may be a schematic top view corresponding to FIG. 9A. Moreover, for clarity, a fastener 630 shown in FIG. 9A is omitted in FIG. 9B.

As shown in FIG. 9A or 9B, a carrier 620 may have a bearing surface 620b corresponding to the pin 200, the fastener 630 is disposed corresponding to the carrier 620, and the bearing surface 620b may be inclined. Accordingly, the pin 200 may be directly or indirectly accommodated in the carrier 620. For example, a corresponding elastic body 610 may be disposed between the fastener 630 and the pin 200, and the fastener 630 may indirectly press the pin 200 through the elastic body 610.

Referring to FIG. 1 and FIG. 9A, in an embodiment, the pin 200 may be in contact with the bearing surface 620b of the carrier 620.

In an embodiment, after the flexible carrier 300 with at least one electronic device 400 disposed thereon and the target substrate 500 are configured at the corresponding positions, the light source 140 may be optionally applied to emit a beam L1 to the electronic device 400 on the flexible carrier 300. The beam L1 may be a preheating beam, but the disclosure is not limited thereto. In a possible embodiment, the beam L1 may be an alignment beam or a scanning beam.

Moreover, in FIG. 1 or in other similar drawings, the optical path of the beam is only schematically illustrated. In an embodiment not illustrated, suitable optical elements (e.g., light reflecting elements, lenses, filters, apertures, and the like; but the disclosure is not limited thereto) may be disposed on the optical path of the beam.

Figure 2:
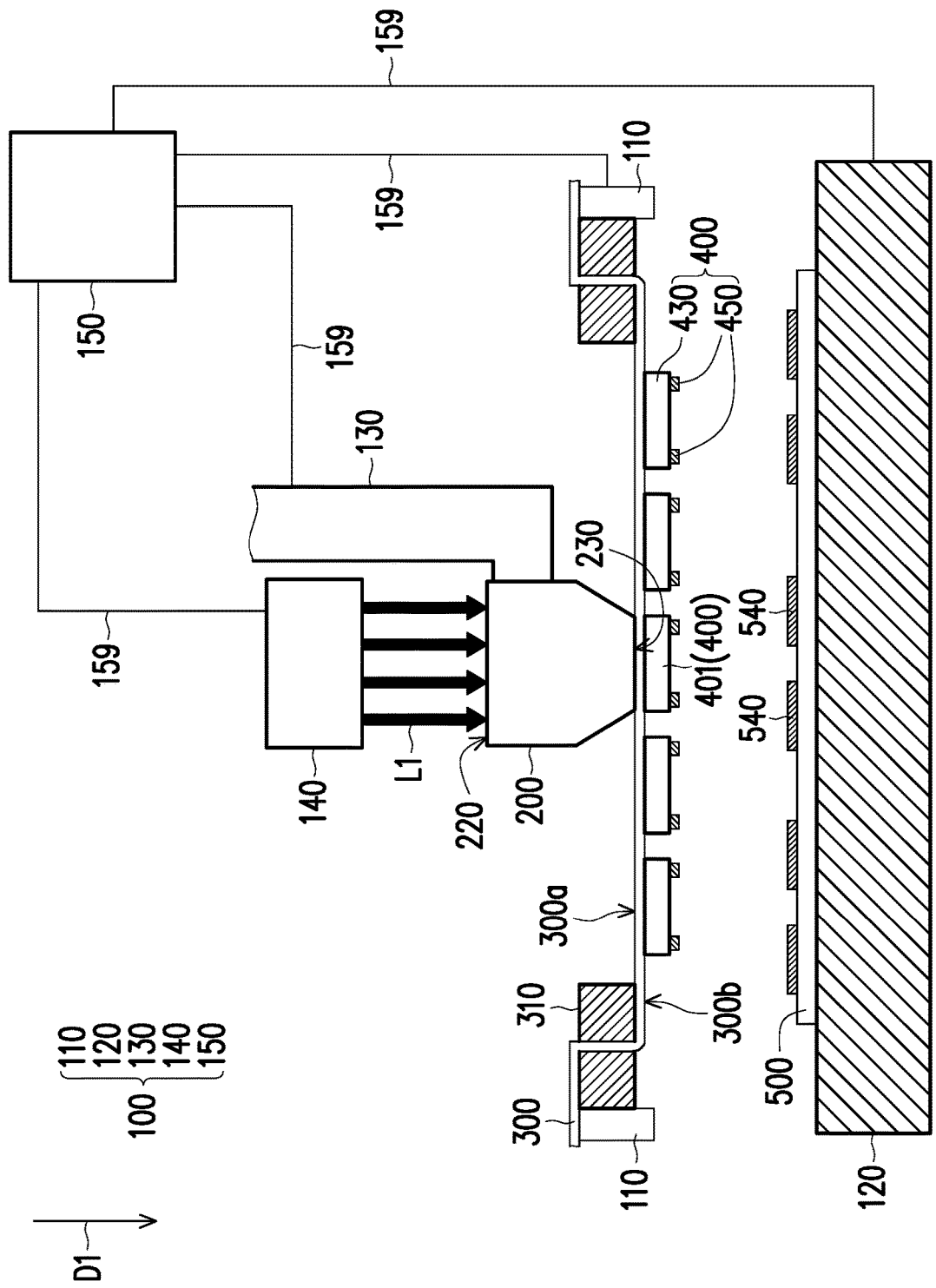
Figure 8:
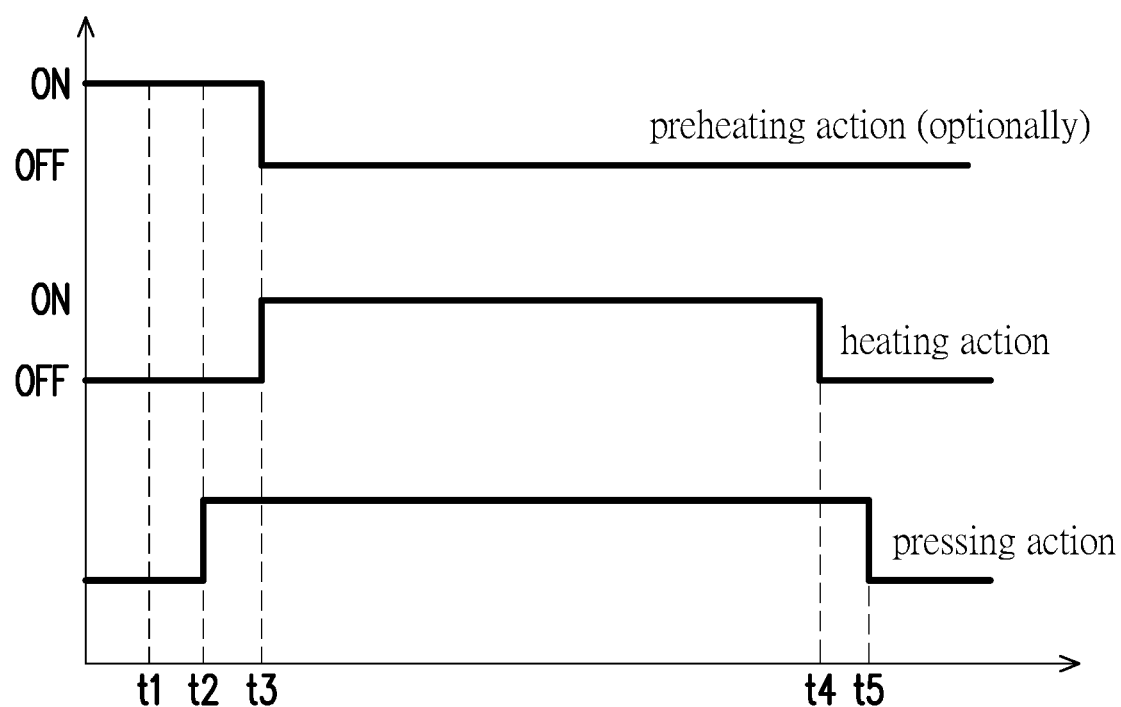
FIG. 8 is a schematic view illustrating a corresponding timing sequence of a portion of the action of an apparatus for transferring an electronic device according to an embodiment of the disclosure.

Referring to FIG. 1 to FIG. 2 (e.g., corresponding to the action from the timing t1 to t2 in FIG. 8), the pin 200 is close to the flexible carrier 300 in the pressing direction D1, and this further allows the pin end 230 of the pin 200 to press a surface (e.g., the first surface 300a) of the flexible carrier 300 where no electronic device 400 is disposed.

Figure 3:
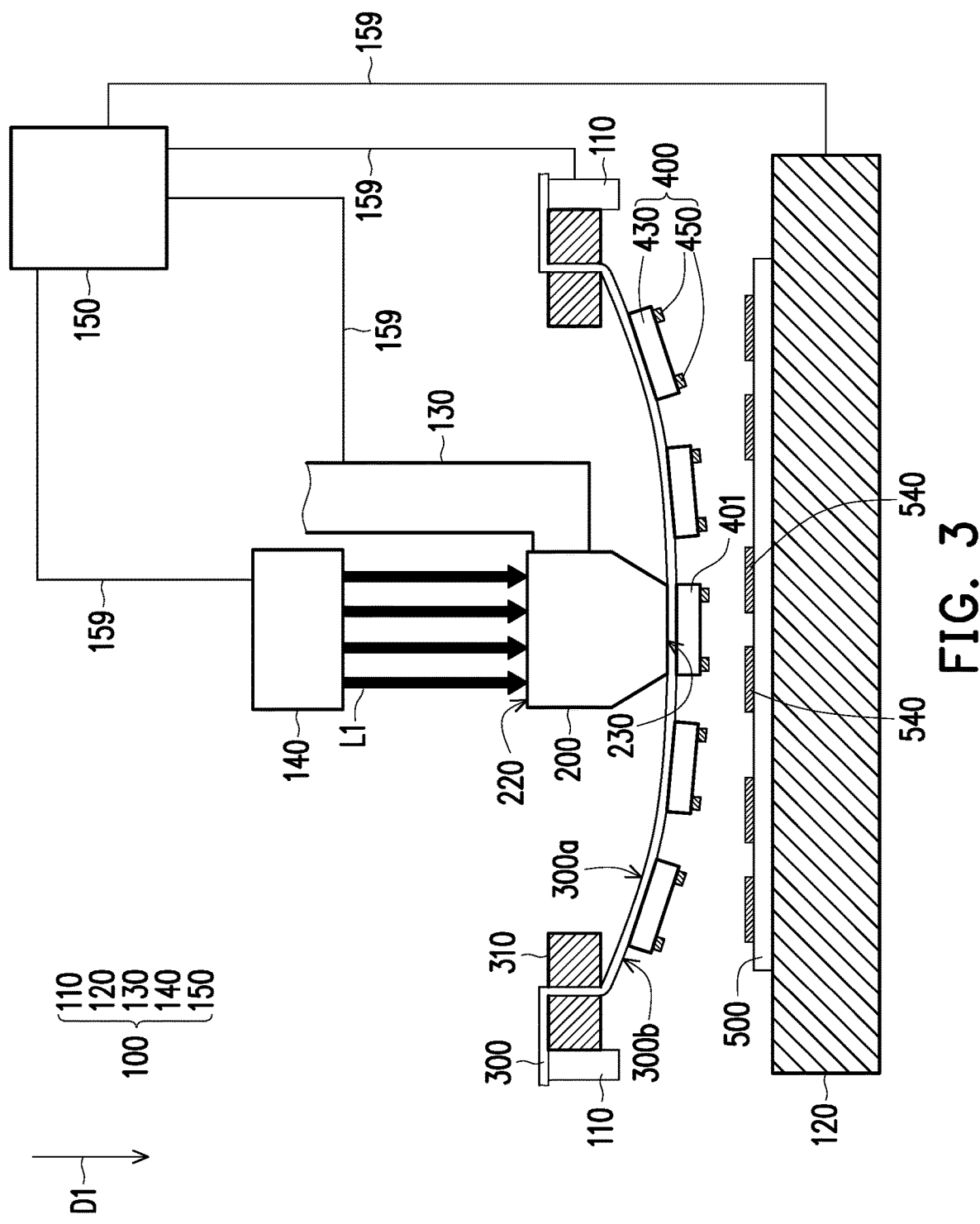

Referring to FIG. 2 to FIG. 3, the pin 200 may further press the flexible carrier 300, and the flexible carrier 300 is correspondingly deformed (i.e., the flexible carrier 300 is bent toward the direction of the target substrate 500). Moreover, an electronic device 401 (one of the electronic devices 400) corresponding to the pin 200 may be close to the target substrate 500 with the pin 200 being close to the target substrate 500. Accordingly, as shown in FIG. 4, the electronic device 401 corresponding to the position where the pin 200 presses the flexible carrier 300 is in contact with the target substrate 500.

Figure 10:
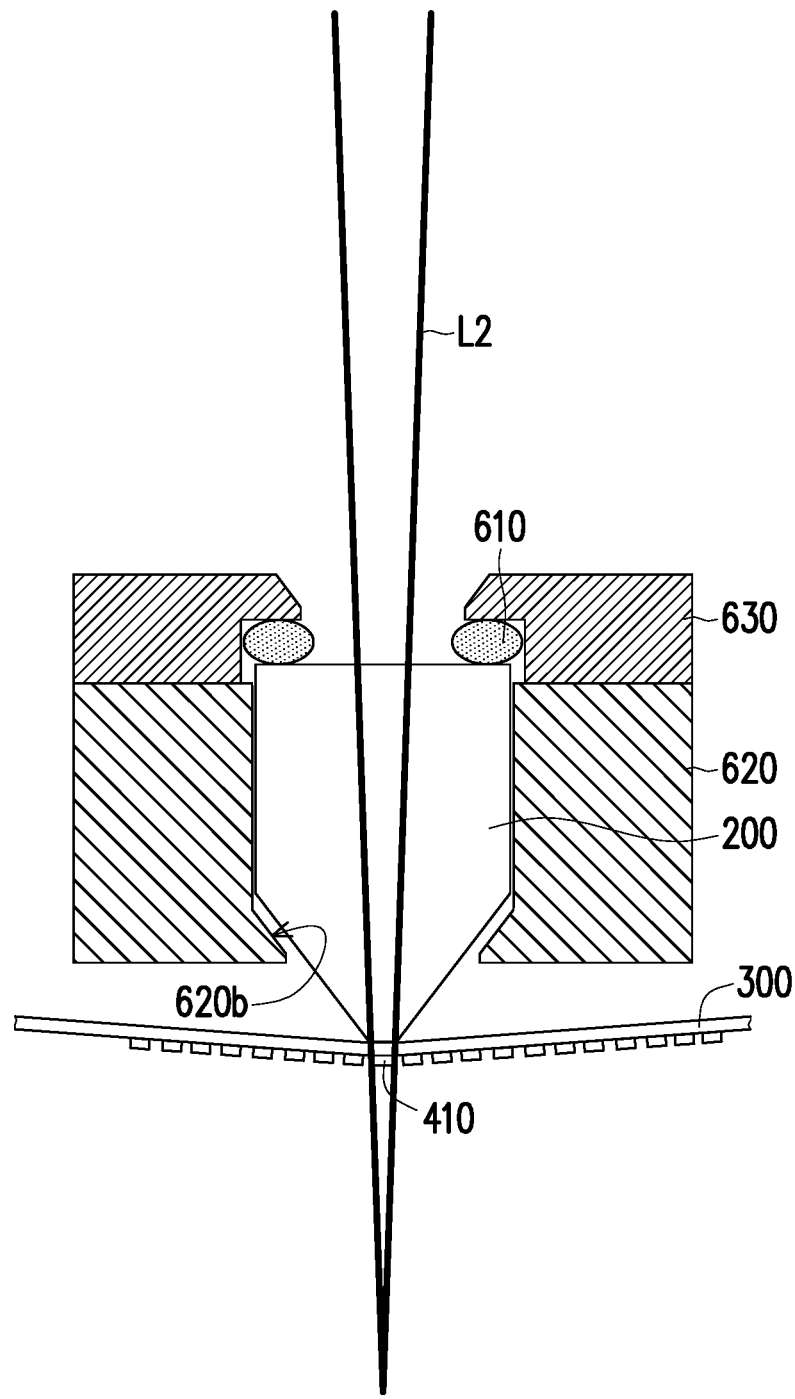
FIG. 10 is a schematic side view of a portion of an apparatus for transferring an electronic device according to an embodiment of the disclosure during operation.

Referring to FIG. 3 and FIG. 10, in an embodiment, after the pin 200 presses the flexible carrier 300 and the flexible carrier 300 is correspondingly deformed, the pin 200 may be separated from the bearing surface 620b of the carrier 620, and the elastic body 610 may correspondingly be compressed in the direction parallel to the pressing direction D1.

Figure 4:
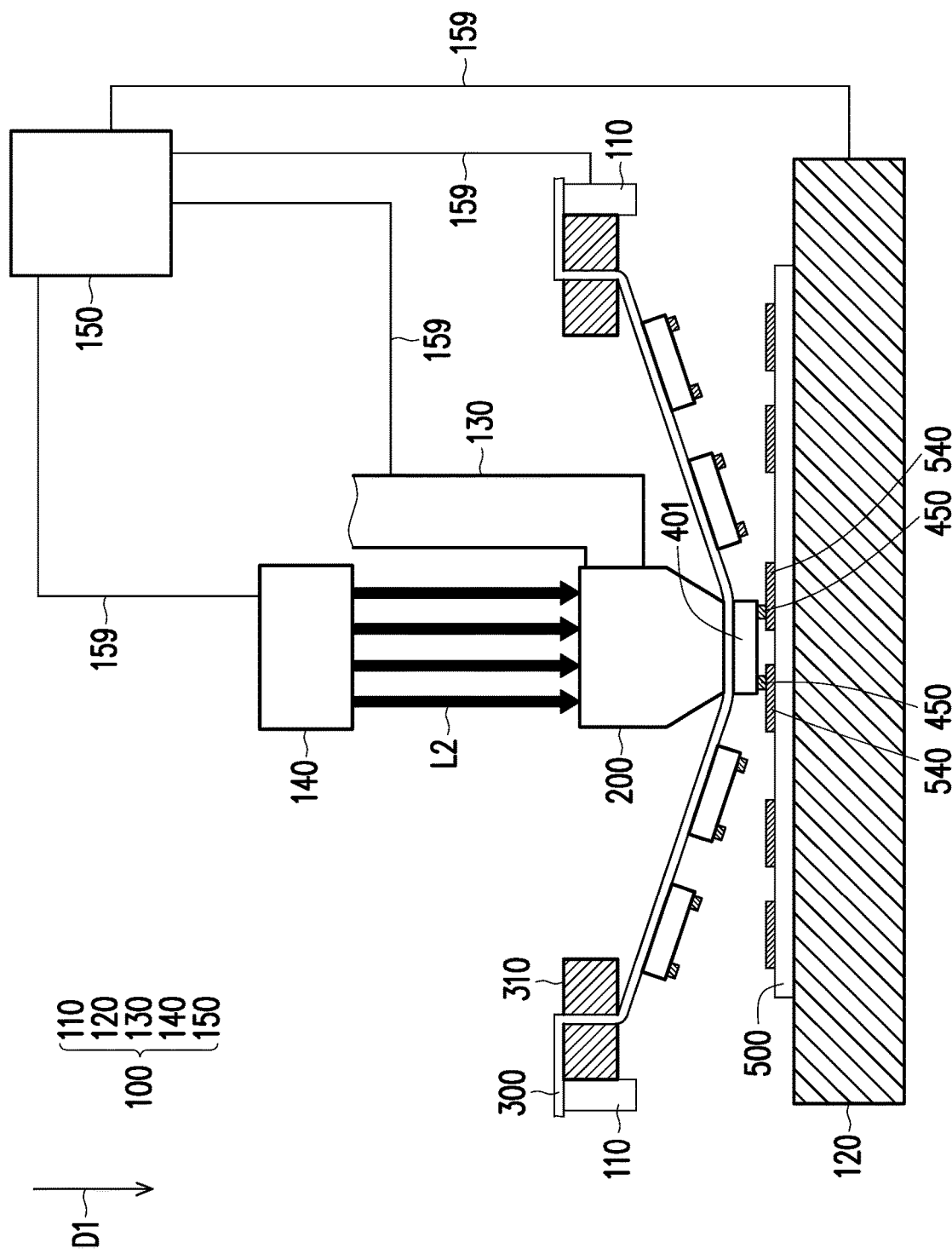

Referring to FIG. 4 (e.g., corresponding to the action at a timing t3 in FIG. 8), when and/or after the electronic device 401 corresponding to the pin 200 is in contact with the target substrate 500, through the light source 140, a heating beam L2 is emitted to the electronic device 401 on the flexible carrier 300. The heating beam L2 may transmit at least a portion of the pin 200 and be emitted from the pin end 230 of the pin 200, so that at least a portion of the conductive connection element 450 of the electronic device 401 corresponding to the pin 200 is melted, and the melted at least a portion of the conductive connecting element 450 may be in contact with the corresponding pads 540 on the target substrate 500. Then, the emission of the heating beam L2 may be stopped (e.g., corresponding to the action at the timing t4 in FIG. 8), and heat may be dissipated in an appropriate way (e.g., by a fan or other active heat dissipation methods; or by a passive heat dissipation method to set it aside for a period of time), so that the electronic device 401 is soldered and fixed on the target substrate 500 and electrically connected to the corresponding circuit on the target substrate 500.

Figure 5:
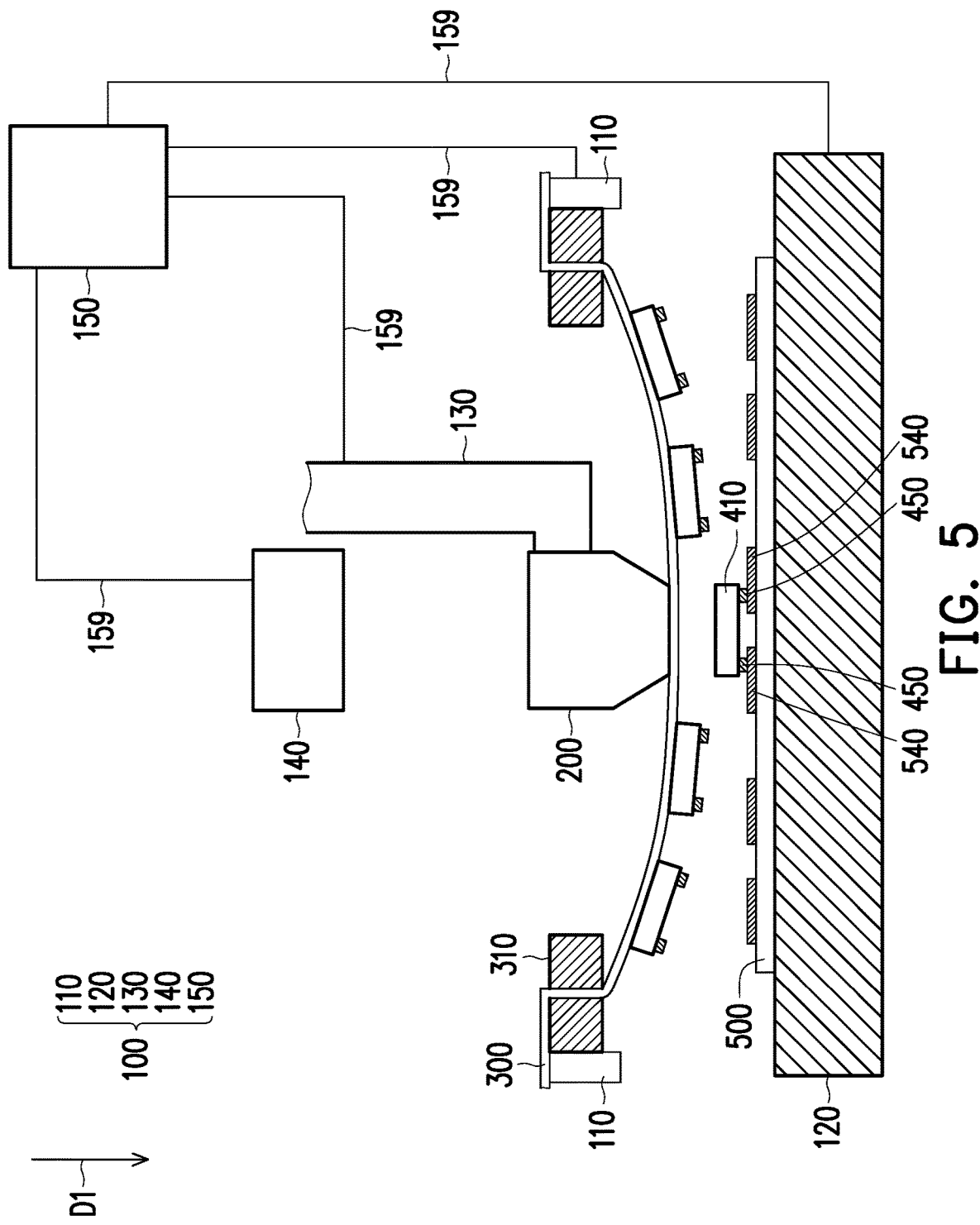
Figure 6:
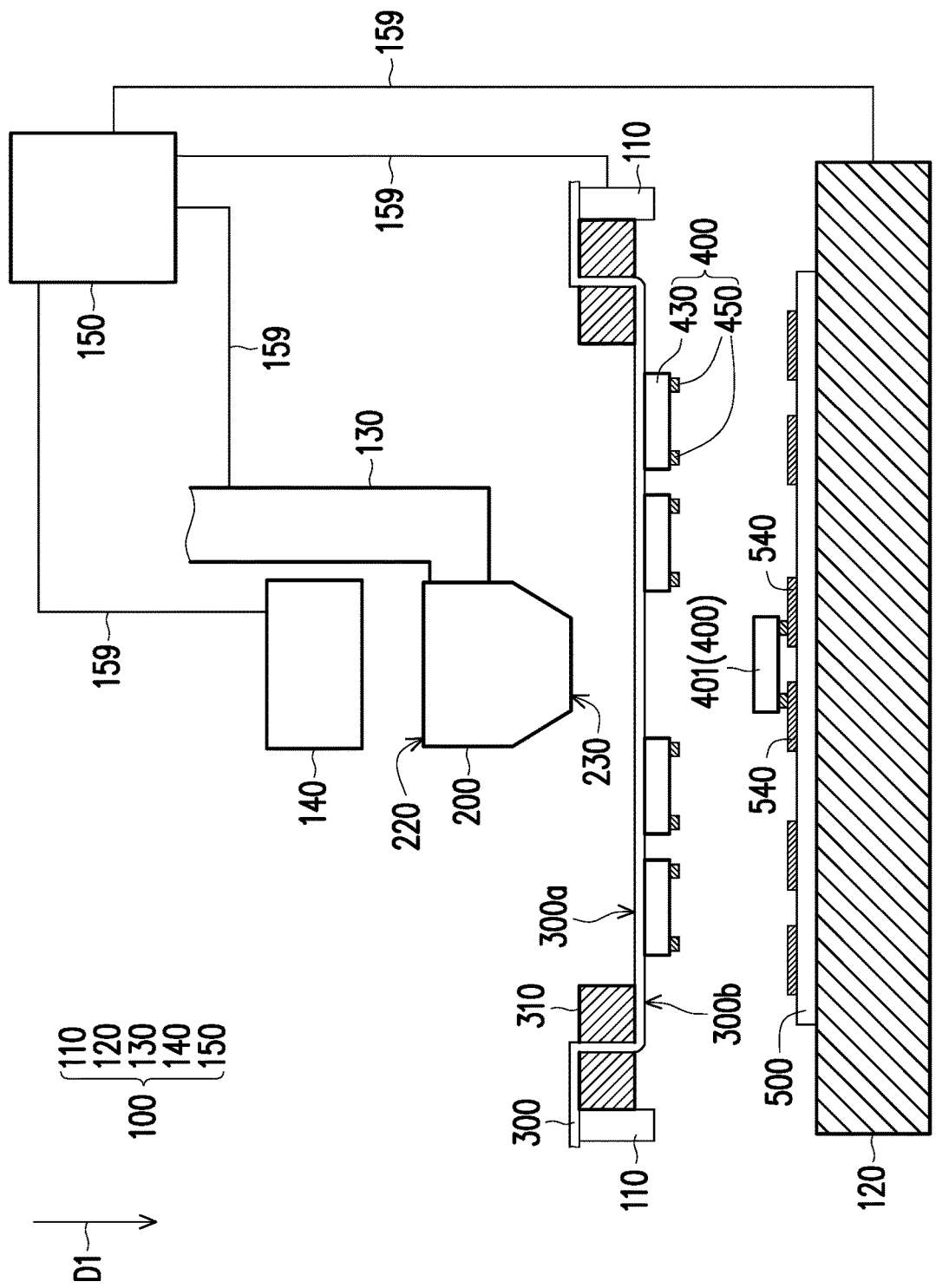

Referring to FIG. 4, FIG. 5, and FIG. 8, the pin 200 is moved away from the target substrate 500, so that the flexible carrier 300 with appropriate elasticity/flexibility may be restored to the original shape as shown in FIG. 6 (e.g., corresponding to the action after the timing t5 in FIG. 8). Moreover, since after the electronic device 401 is soldered and fixed on the target substrate 500, the bonding force between the electronic device 401 and the target substrate 500 is greater than the bonding force between the electronic device 401 and the flexible carrier 300, the electronic device 401 soldered and fixed on the target substrate 500 may be separated from the carrier. Accordingly, the transfer action and the soldering action of the electronic device 401 may be completed by the single step.

By the method, the electronic device 401 may be transferred from the flexible carrier 300 to the target substrate 500. Therefore, the method for transferring an electronic device (e.g., the electronic device 401 or other similar electronic devices) may also be referred to as a transfer bonding process.

Figure 7:
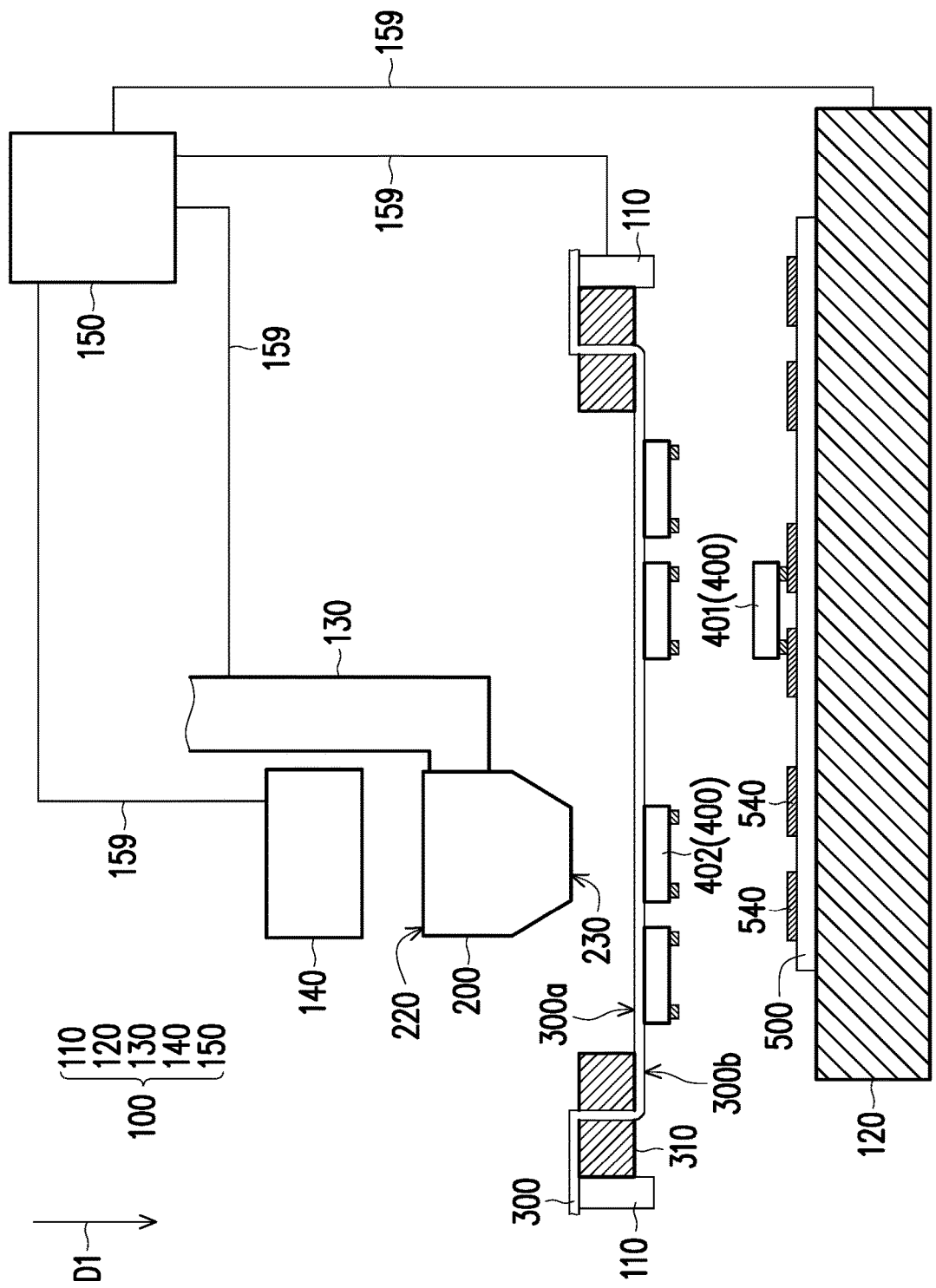

Referring to FIG. 6 to FIG. 7, in an embodiment, after completing the transfer of the electronic device 401, the first frame 110, the second frame 120, the actuating mechanism 130, and/or the light source 140 may be moved in an appropriate direction (e.g., a direction perpendicular to the pressing direction D1), and another electronic device 402 (another one of the electronic devices 400) is transferred in the same or similar manner as described.

In the embodiment, the first frame 110, the second frame 120, the actuating mechanism 130, and the light source 140 may constitute the apparatus 100. That is, the apparatus 100 may include a first frame, a second frame, an actuating mechanism, and a light source, and the apparatus 100 is adapted for transferring the electronic device 400 from the flexible carrier 300 to the target substrate 500 by soldering. That is, the apparatus 100 may be referred to as a transfer soldering apparatus.

In the embodiment, the apparatus 100 may further include a control system 150. The control system 150 may be signal-connected to the corresponding member, element, or unit (e.g., the first frame 110, the second frame 120, the actuating mechanism 130, and/or the light source 140, but the disclosure is not limited thereto) by wired signal transmission through a corresponding signal wire 159. However, the disclosure is not limited thereto. In an embodiment, the control system 150 may be signal-connected to the corresponding member, element, or unit by wireless signal transmission. That is, the apparatus 100 including the control system 150 and the first frame 110, the second frame 120, the actuating mechanism 130, and the light source 140 to which the signals are connected is one single equipment or machine. Moreover, the signal connection mentioned in the disclosure may generally refer to a connection mode of wired signal transmission or wireless signal transmission. Moreover, the disclosure does not limit all signal connection modes to be the same or different.

In summary, with the method for transferring an electronic device of the disclosure, the pressing action or transfer action of the pin may be integrated with the irradiation or heating soldering action of the light source by the cooperation of the pin and the light source, and the electronic devices are directly transferred from the flexible carrier to the target substrate and soldered. Accordingly, the alignment accuracy or the alignment precision may be improved during the transfer process of electronic devices, thereby improving the soldering effect, and/or reducing the process time, equipment cost, and/or the use of consumables (e.g., temporary carriers and glue), so as to improve production efficiency. Moreover, the method for transferring an electronic device may be used in conjunction with the apparatus, so that the apparatus that may be used to transfer electronic devices may be adapted to transfer the electronic devices on the flexible carrier to the target substrate.

What is claimed is:

1. A method for transferring an electronic device, comprising:
   providing a flexible carrier having a first surface on which the electronic device to be transferred is disposed and a second surface which is opposite to the first surface;
   providing a target substrate;

providing a pin which is light-transmissible and has a pressing end;

arranging the flexible carrier and the target substrate in a way that the flexible carrier is spaced from the target substrate with the first surface thereof facing the target substrate;

deforming the flexible carrier by exerting the pin to press the second surface of the flexible carrier with the pressing end thereof at a position corresponding to the electronic device disposed on the first surface of the flexible carrier until the electronic device is in contact with the target substrate;

applying an energy beam which is emitted from a light source standing outside the pin and then travels through the pin and goes out from the pressing end of the pin to bond the electronic device onto the target substrate; and releasing the pin from pressing the flexible carrier.

2. The method for transferring the electronic device according to claim 1, wherein the pin is made of a transparent material.

3. The method for transferring the electronic device according to claim 2, wherein the transparent material is selected from the group consisting of sapphire, diamond, and quartz.

4. The method for transferring the electronic device according to claim 1, wherein the energy beam is a laser beam.

5. The method for transferring the electronic device according to claim 1, wherein the electronic device is an LED chip.

6. A method for making an LED display, comprising:

performing the method for transferring the electronic device according to claim 5 to transfer the LED chip onto the target substrate.

7. The method for making an LED display according to claim 6, wherein the target substrate is a TFT substrate.

* * * * *